United States Patent
Kawamura et al.

(10) Patent No.: US 8,001,683 B2
(45) Date of Patent: Aug. 23, 2011

(54) SOLDER BALL LOADING METHOD

(75) Inventors: Yoichiro Kawamura, Ibi-gun (JP);
Katsuhiko Tanno, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 301 days.

(21) Appl. No.: 12/023,657

(22) Filed: Jan. 31, 2008

(65) Prior Publication Data
US 2008/0120832 A1    May 29, 2008

Related U.S. Application Data

(62) Division of application No. 11/411,178, filed on Apr. 26, 2006, now Pat. No. 7,472,473.

(51) Int. Cl.
*H01K 3/00* (2006.01)
*B23K 31/00* (2006.01)

(52) U.S. Cl. .. 29/843; 29/842; 228/180.21; 228/180.22; 438/612; 438/613

(58) Field of Classification Search .................. 29/825, 29/830, 842, 843; 228/180.21, 180.22; 438/612, 438/613
See application file for complete search history.

(56) References Cited

U.S. PATENT DOCUMENTS

| | | | |
|---|---|---|---|
| 6,541,364 B2 * | 4/2003 | Mukuno et al. | 438/612 |
| 6,793,116 B2 | 9/2004 | Harada | |
| 6,889,886 B2 * | 5/2005 | Hazeyama et al. | 228/39 |
| 6,926,188 B2 * | 8/2005 | Hazeyama et al. | 228/41 |
| 7,475,803 B2 * | 1/2009 | Sumita et al. | 228/246 |
| 2002/0058406 A1 * | 5/2002 | Mukuno et al. | 438/626 |
| 2002/0135064 A1 * | 9/2002 | Hazeyama et al. | 257/737 |
| 2004/0094601 A1 * | 5/2004 | Hazeyama et al. | 228/41 |
| 2005/0045701 A1 | 3/2005 | Shindo et al. | |
| 2005/0242155 A1 * | 11/2005 | Reiber | 228/4.5 |
| 2006/0157540 A1 | 7/2006 | Sumita et al. | |
| 2007/0130764 A1 | 6/2007 | Nebashi et al. | |
| 2007/0251089 A1 * | 11/2007 | Kawamura et al. | 29/874 |

FOREIGN PATENT DOCUMENTS

| | | |
|---|---|---|
| JP | 2001-127421 | 5/2001 |
| JP | 2006-73999 | 3/2006 |
| JP | 2006-74000 | 3/2006 |

(Continued)

OTHER PUBLICATIONS

Supplementary European Search Report, dated May 3, 2010, Application No. 077420024.8.

Supplementary european Search Report, dated May 3, 2010, Application No. 07742024.8. All references marked with an asertisk * were considered by the Examiner on March 16, 2010, and Jun. 28, 2010.

*Primary Examiner* — C. J Arbes

(74) *Attorney, Agent, or Firm* — Oblon, Spivak, McClelland, Maier & Neustadt, L.L.P.

(57) ABSTRACT

This invention provides a solder ball loading apparatus which enables fine solder balls to be loaded on pads while void is blocked from being caught into bump upon reflow. Inactive gas is supplied and the inactive gas is sucked from a loading cylinder located above a ball arrangement mask so as to gather solder balls. The gathered solder balls are rolled on the ball arrangement mask by moving the loading cylinder horizontally and the solder balls are dropped onto connecting pads on a multilayer printed wiring board through openings in the ball arrangement mask. Oxidation of the solder balls and mixture of voids upon reflow are prevented by loading the solder balls in the atmosphere of inactive gas.

5 Claims, 10 Drawing Sheets

FOREIGN PATENT DOCUMENTS

| | | |
|---|---|---|
| JP | 2006-74001 | 3/2006 |
| JP | 2006-74002 | 3/2006 |
| WO | 2006004000 A1 | 1/2006 |
| WO | WO 2006/013742 | 2/2006 |

* cited by examiner

SOLDER BALL LOADING METHOD

CROSS REFERENCE TO RELATED APPLICATIONS

This application is a division of and claims the benefit of priority under 35 U.S.C. §120 from U.S. Ser. No. 11/411,178, filed Apr. 26, 2006. The contents of the application are incorporated herein by reference.

BACKGROUND OF THE INVENTION

Field of the Invention

The present invention relates to a solder ball loading method and a solder ball loading apparatus for loading a solder ball which turns to be a solder bump on a printed wiring board.

According to JP2006-74001A, the solder balls are loaded on the pads of the printed wiring board by a manufacturing method including following processes.
(1) Align an opening of an arrangement mask with the pad of the printed wiring board.
(2) Gather the solder balls on the arrangement mask below a cylindrical member by sucking air with the cylindrical member.
(3) Load the solder balls on the pads of the printed wiring board through the openings in the arrangement mask by moving the cylindrical member.

SUMMARY OF THE INVENTION

An object of the present invention is to provide a solder ball loading method and a solder ball loading apparatus which enables fine solder balls to be loaded on pads while void is blocked from being caught into bump upon reflow.

In order to achieve the above object, a solder ball loading method for loading solder balls that turn to be solder bumps on pads of a printed wiring board using a ball arrangement mask having a plurality of openings corresponding to the pads in the printed wiring board, the solder ball loading method according to the present invention is characterized by comprising:
gathering solder balls on the ball arrangement mask just below a cylinder member by locating the cylinder member having an opening portion facing the ball arrangement mask above the ball arrangement mask, supplying inactive gas or reducing gas at least to the surrounding of the opening portion in the cylinder member and sucking inactive gas or reducing gas around the cylinder member; and
dropping the solder balls gathered just below the cylinder member onto the pads on the printed wiring board through the opening in the ball arrangement mask by moving the cylinder member or the ball arrangement mask and the printed wiring board.

A solder ball loading apparatus for loading solder balls that turn to be solder bumps on pads of the printed wiring board, according to the present invention is characterized by comprising:
a ball arrangement mask including a plurality of openings corresponding to the pads of the printed wiring board;
a cylinder member that is located above the ball arrangement mask for gathering solder balls just below the opening portion by sucking inactive gas or reducing gas from the opening portion;
a gas supply unit for supplying inactive gas or reducing gas at least to the surrounding of the opening portion in the cylinder member; and
a moving mechanism for moving the cylinder member or the ball arrangement mask and the printed wiring board, that drops the solder balls gathered just below the cylinder member onto the pads of the printed wiring board through openings in the ball arrangement mask by moving the cylinder member or the ball arrangement mask and the printed wiring board.

According to the solder ball loading method of the first aspect of the invention and the solder ball loading apparatus of the second aspect, the cylinder member is located above the ball arrangement mask, inactive gas or reducing gas is supplied at least to the surrounding of the opening portion in the cylinder member and the active gas or reducing gas is sucked from the opening portion in the cylinder member so as to gather the solder balls. The solder balls gathered just below the cylinder member are moved on the ball arrangement mask by moving the ball arrangement mask and printed wiring board and dropped onto the pads of the printed wiring board through the openings in the ball arrangement mask. Thus, fine solder balls can be loaded on all the pads of the printed wiring board securely. Because the solder balls are moved without any contact, the solder balls can be loaded without any damage on the pads different from a case using a squeegee, so that the heights of the solder bumps can be equalized. Further, the solder balls can be loaded on the pads of a printed wiring board having much unevenness on its surface like a built-up multilayer wiring board. Because inactive gas or reducing gas is used, the solder balls can be loaded on the pads of the printed wiring board in a condition in which oxide film does not exist on the surface of the solder ball or the film is thin. As a consequence, the wettability of solder on the pad upon reflow is improved thereby void being unlikely to occur in the bump. The pad is preferred to be coated with flux. If flux is applied to the pad, the solder ball is covered with flux in the pad so as to protect the bottom portion of the solder ball from contact with air.

Because the cylinder members are arranged in line corresponding to the width of the printed wiring board in the solder ball loading apparatus of the third aspect, the solder balls can be loaded on all the pads of the printed wiring board securely by moving the ball arrangement mask and the printed wiring board vertically with respect to the column direction of the cylinder members.

Even if the solder balls are charged due to a collision with each other when they are moved on the ball arrangement mask of the solder ball loading apparatus of the fourth aspect, the small, lightweight solder balls do not adhere to the cylinder member due to static electricity because at least a solder ball contacting portion of the cylinder member is constituted of conductive member so that the solder balls can be loaded on the printed wiring board securely.

Because the outer cylinder for supplying inactive gas or reducing gas is provided around the cylinder member of the fifth aspect, the solder balls can be gathered without any contact with air by supplying inactive gas or reducing gas by a minimum quantity of inactive gas or reducing gas necessary.

DESCRIPTION OF THE PREFERRED EMBODIMENTS

Figure 7:
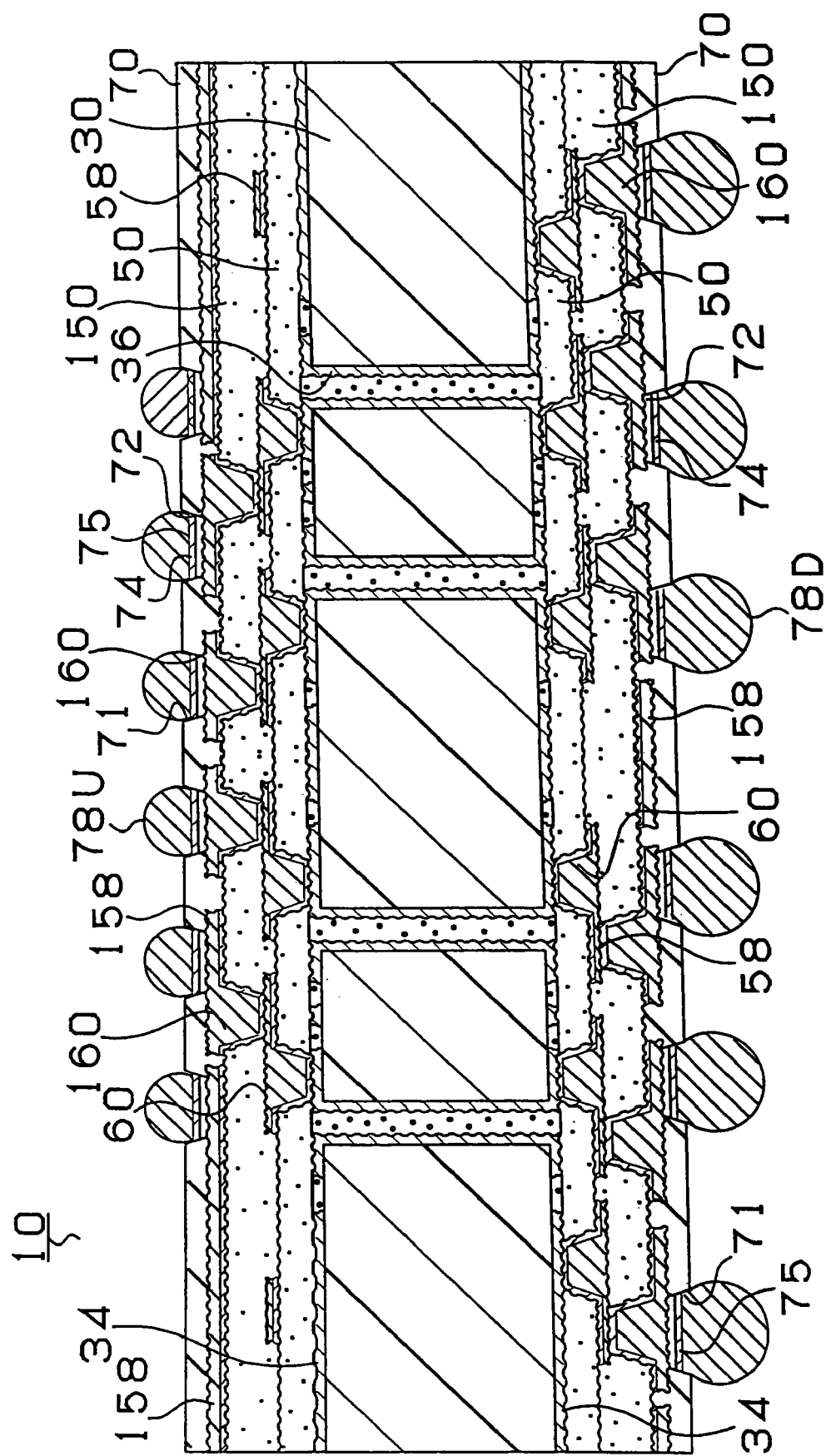
FIG. 7 is a sectional view of the multi-layer printed wiring board.
Figure 8:
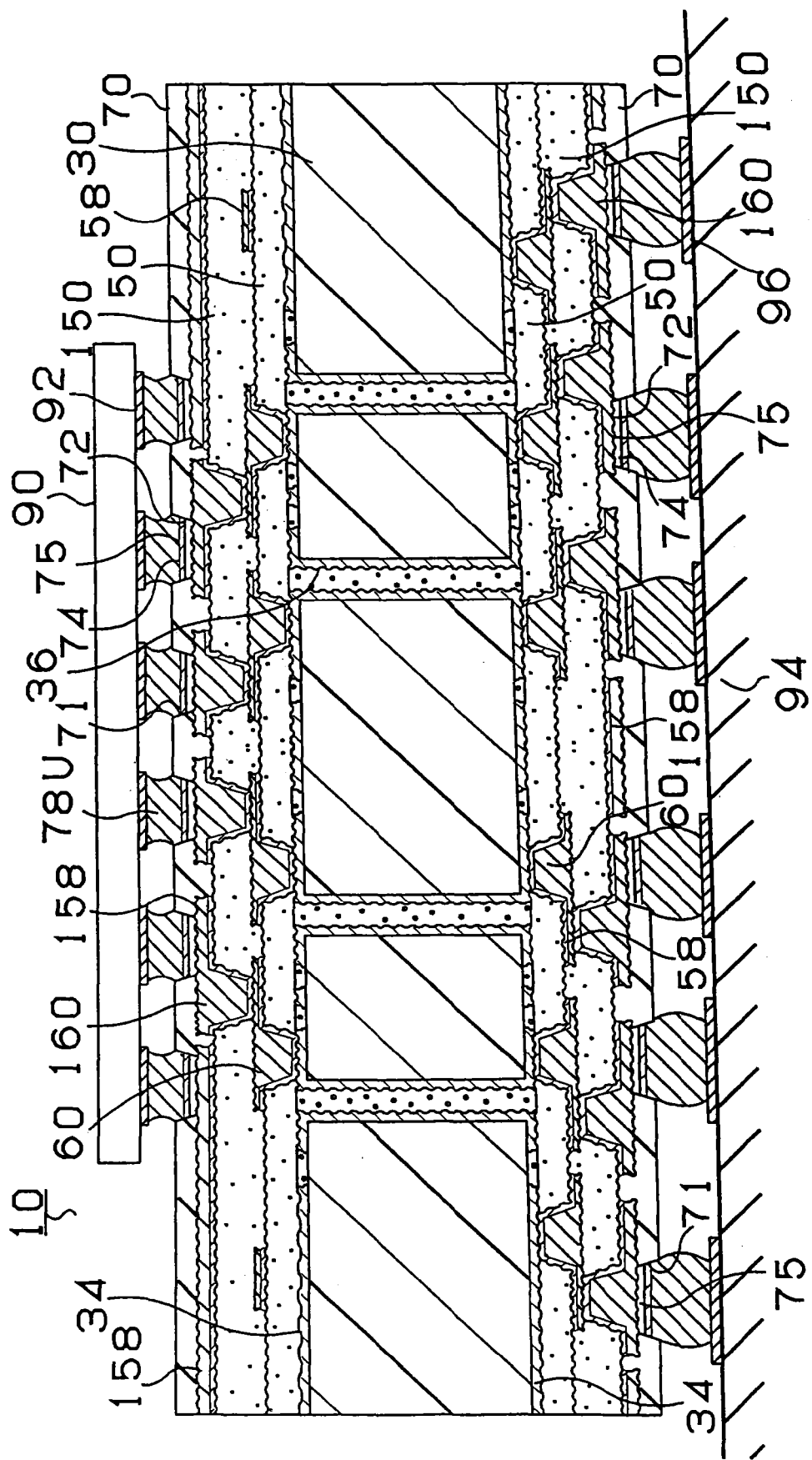
FIG. 8 is a sectional view showing a condition in which an IC chip is mounted on the multi-layer printed wiring board shown in FIG. 7, which is loaded on a daughter board.

First, the structure of the multi-layer printed wiring board 10 manufactured using the solder ball loading method and loading apparatus of the first embodiment of the present invention will be described with reference to FIGS. 7 and 8. FIG. 7 shows a sectional view of the multi-layer printed wiring board 10 and FIG. 8 shows a condition in which an IC chip 90 is mounted on the multi-layer printed wiring board 10 shown in FIG. 7, which is loaded on a daughter board 94. In the multi-layer printed wiring board 10 as shown in FIG. 7, conductive circuits 34 are formed on both faces of its core substrate 30. The top face and bottom face of the core substrate 30 are connected through through-holes 36.

A conductive circuit 58 for forming conductive circuit layer is formed on the conductive circuit 34 of the core substrate 30 through inter-layer resin insulating layer 50. The conductive layer 58 is connected to the conductive circuit 34 through via hole conductors 60. A conductive circuit 158 is formed on the conductive circuit 58 through interlayer resin insulating layer 150. The conductive circuit 158 is connected to the conductive circuit 58 through the via hole conductor 160 formed in the interlayer resin insulating layer 150.

Solder resist layer 70 is formed above the via hole conductor 160 and the conductive circuit 158 and pad 75 is formed by providing nickel plating layer 72 and gold plating layer 74 in an opening 71 of the solder resist layer 70. Solder bump 78U is formed on pad 75 on the top face and ball grid array (BGA) 78D is formed on pad 75 on the bottom face.

As shown in FIG. 8, the solder bump 78U on the top face of the multilayer printed wiring board 10 is connected to an electrode 92 of the IC chip 90. On the other hand, the BGA 78D on the bottom side is connected to the land 96 of the daughter board 94.

Figure 6A:
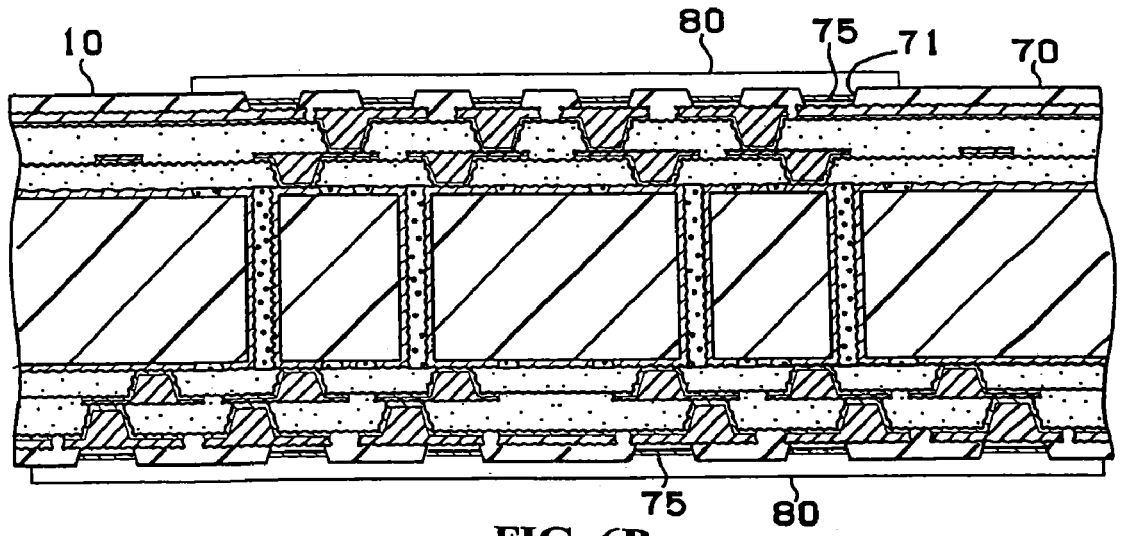
FIG. 6(A), FIG. 6(B), FIG. 6(C) are explanatory diagrams of the manufacturing process of the multi-layer printed wiring board.
Figure 6B:
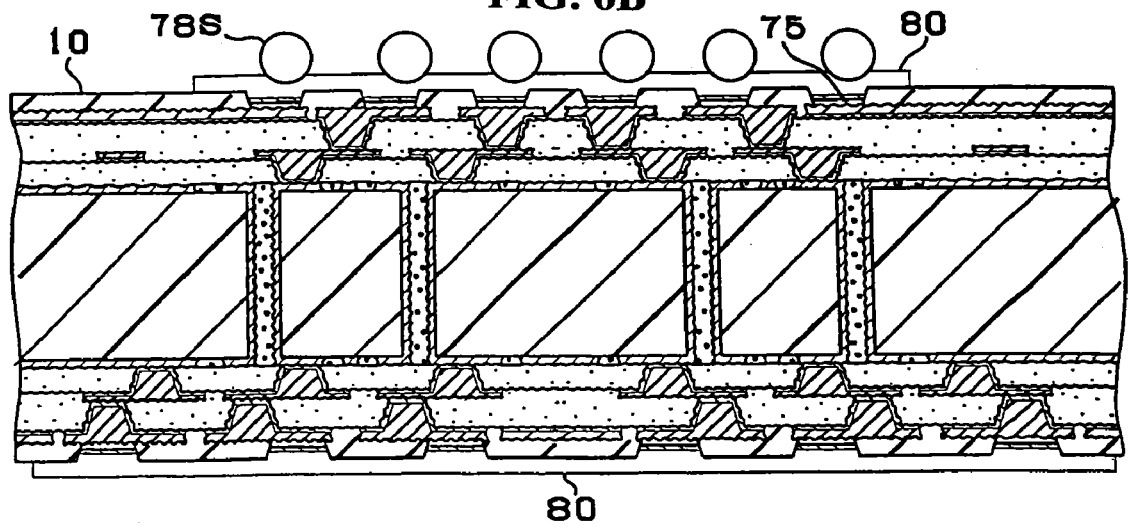

FIG. 6 is an explanatory diagram of a process for forming the solder bump on the multilayer printed wiring board 10. As shown in FIG. 6(A), flux 80 is printed on the surface of the multilayer printed wiring board 10 in which the pad 75 is formed in the opening 71 of the solder resist layer 70 on the front surface. As shown in FIG. 6(B), fine solder balls 78s (for example, manufactured by HITACHI METALS, LTD. or TAMURA, 40 µm or more to less than 200 µm in diameter) are loaded on the pads 75 on the top face of the multilayer printed wiring board 10 by means of the solder ball loading apparatus. The solder ball is preferred to be less than 200 µm in diameter to correspond to miniaturized structure. If the diameter is less than 40 µm, the solder ball is too light so that it is hard to drop on the pad. On the other hand, if the diameter is over 200 µm, it is too heavy, so that the solder balls cannot be gathered in a cylindrical member and thus, a pad loaded with no solder ball is likely to appear.

Figure 6C:
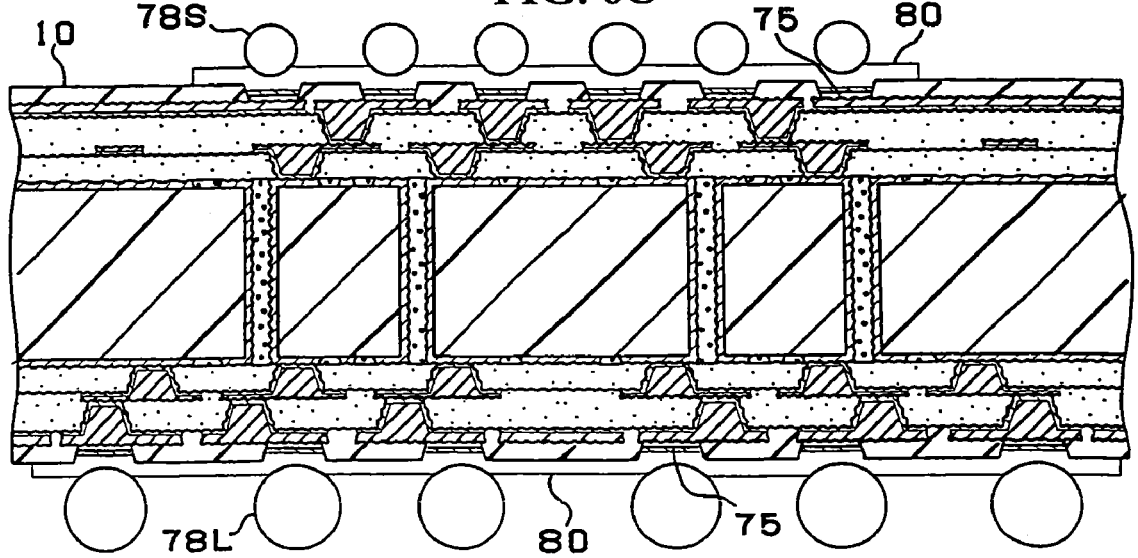

After that, the solder ball 78L having a normal diameter (250 µm in diameter) is sucked by a suction head based on the conventional art and placed on the pad 75 on the bottom face of the multilayer printed wiring board 10 as shown in FIG. 6(C). After that, as shown in FIG. 7, for example, 2,000 solder bumps 78U are formed at a pitch of 60-150 µm on the top face of the multilayer printed wiring board 10 and for example, 250 BGAs 78D are formed at a pitch of 2 mm on the bottom face. If the pitch is less than 60 µm, it is difficult to manufacture a solder ball suitable for that pitch. If the pitch is over 150 µm, the solder balls may be produced by printing although they can be produced without any problem according to this method. After the IC chip 90 is loaded by reflow via the solder bumps 78U as shown in FIG. 8, the multilayer printed wiring board 10 loaded with the IC chip 90 is mounted on the daughter board 94 via the BGAs 78D.

Figure 1A:
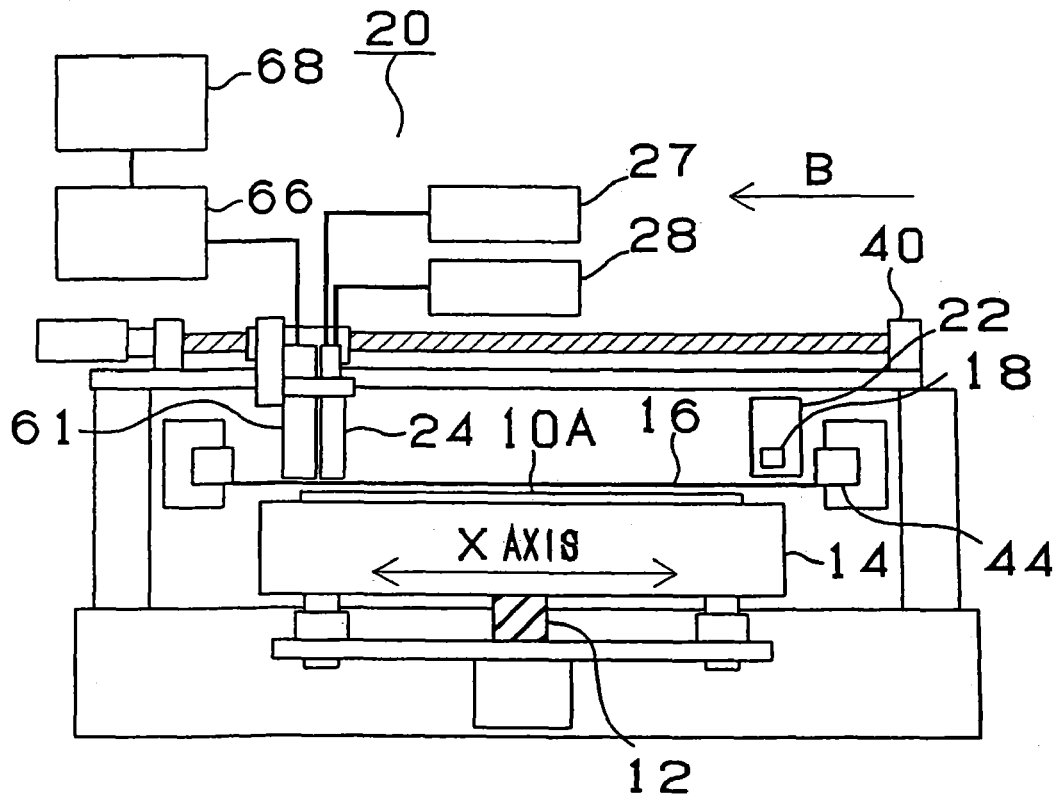
FIG. 1(A) is a diagram showing the structure of a solder ball loading apparatus according to a first embodiment of the present invention and FIG. 1(B) is a view taken in the direction of an arrow B of the solder ball loading apparatus of FIG. 1(A)
Figure 1B:
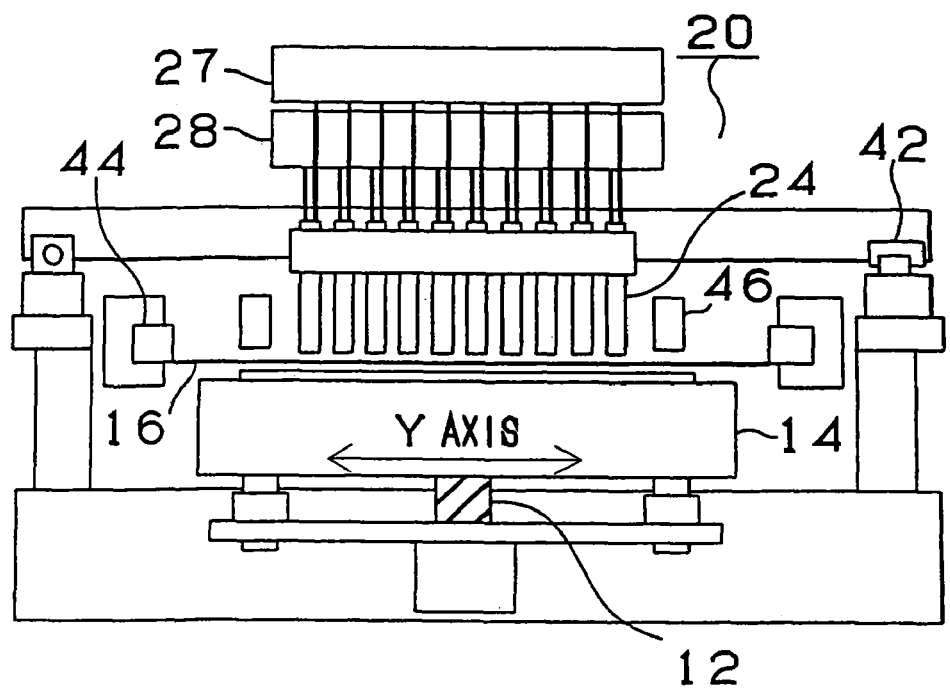

The solder ball loading apparatus for loading the fine solder ball 78s having a minute diameter (less than 200 µm in diameter) on the pad of the multilayer printed wiring board described with reference to FIG. 6(B) will be described with reference to FIG. 1. FIG. 1(A) is a diagram showing the structure of the solder ball loading apparatus according to the first embodiment and FIG. 1(B) is a view taken in the direction of an arrow B of the solder ball loading apparatus.

The solder ball loading apparatus 20 comprises a XYθ suction table 14 for positioning and holding the multilayer printed wiring board 10, a vertically-moving shaft 12 for lifting the XYθ suction table 14, a ball arrangement mask 16 having an opening corresponding to the pad 75 of the multilayer printed wiring board, a loading cylinder (cylindrical member) 24 for introducing the solder balls, a suction box 27 for supplying the loading cylinder 24 with a negative pressure, an inactive gas cylinder 28 for supplying inactive gas to raise the inactive gas atmosphere in the loading cylinder 24, a ball removing cylinder 61 for collecting excessive solder balls, a suction box 66 for supplying the ball removing cylinder 61 with a negative pressure, a ball removing suction unit 68 for holding collected solder balls, a mask clamp 44 for clamping the ball arrangement mask 16, an alignment camera 46 for photographing the multilayer printed wiring board 10, a remaining amount detecting sensor 18 for detecting the remaining amount of the solder balls under the loading cylinder 24, and a solder ball supply unit 22 for supplying the solder balls to the side of the loading cylinder 24 based on the remaining amount detected by the remaining amount detecting sensor 18.

The plurality of loading cylinders 24 and ball removing cylinders 61 are arranged in line in the Y direction corresponding to the size of a connecting pad area. In the meantime, they may be constructed to correspond to a plurality of the connecting pad areas. The Y direction is specified for convenience and they may be arranged in the X direction. The XYθ suction table 14 positions, sucks, holds, corrects and moves the multilayer printed wiring board 10 to be loaded with the solder balls. The XYθ suction table 14 can move the printed wiring board 10 together with the ball arrangement mask 16 clamped by the mask clamp 44. The alignment camera 46 detects an alignment mark of the multilayer printed wiring board 10 on the XYθ suction table 14 and the positions of the multilayer printed wiring board 10 and the ball arrangement mask 16 are adjusted based on a detected position. The remaining amount detecting sensor 18 detects the remaining amount of the solder balls according to an optical method.

The solder ball loading unit 20 of the first embodiment can carry the solder balls by moving the ball arrangement mask 16 and the printed wiring board 10 with the loading cylinder 24 fixed. Further, the solder balls can be carried by moving the loading cylinder 24 with the ball arrangement mask 16 and the printed wiring board 10 fixed.

Figure 2:
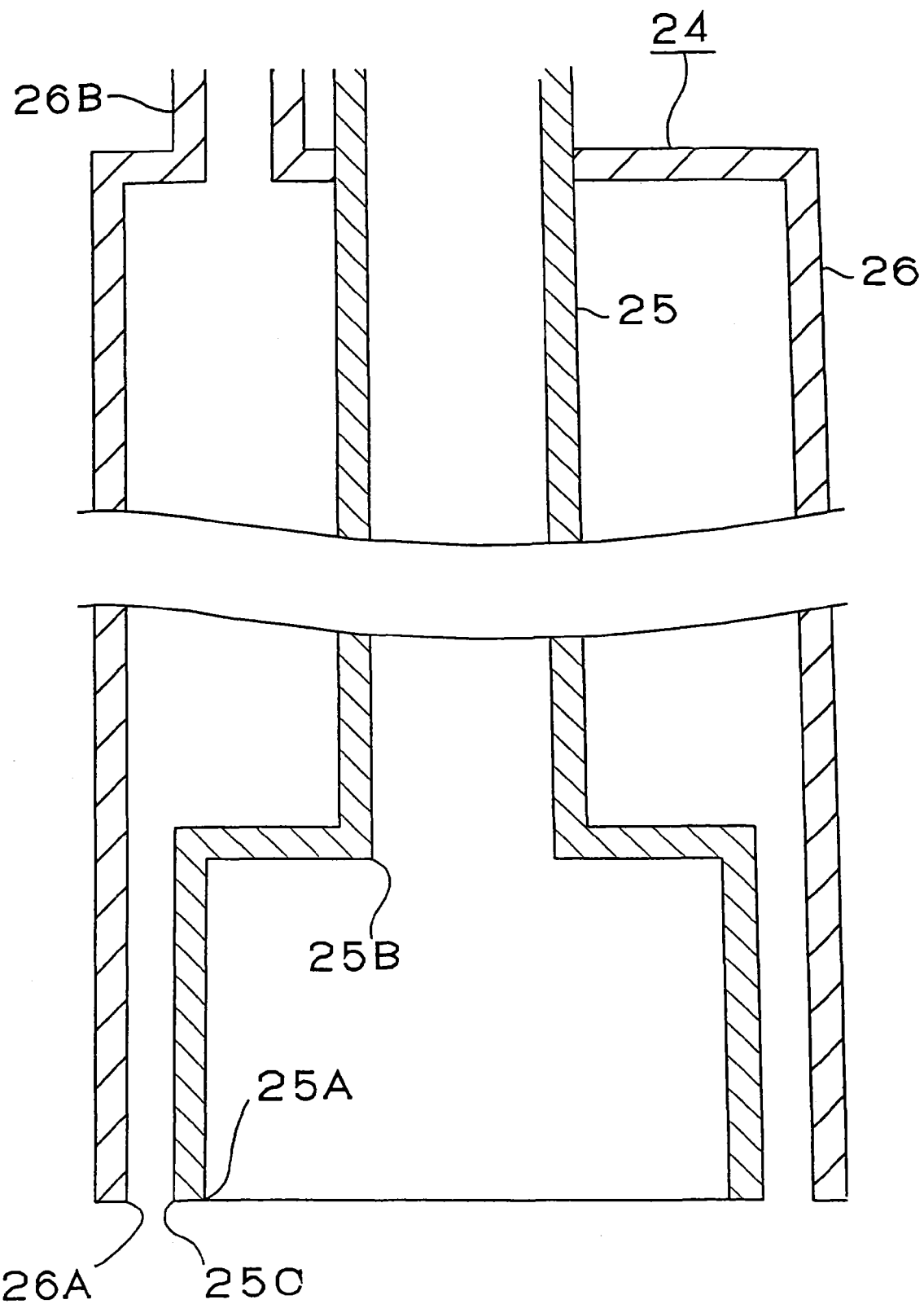
FIG. 2 is a sectional view showing the structure of the loading cylinder of the solder ball loading apparatus according to the first embodiment.

The structure of the loading cylinder 24 will be described with reference to FIG. 2 indicating the section of the loading cylinder 24. The loading cylinder 24 is comprised of a supply cylinder 26 for supplying inactive gas and a suction cylinder 25 for sucking the supplied inactive gas and the supply cylinder 26 is provided around the suction cylinder 25. The inactive gas supplied from the inactive gas cylinder 28 as shown in FIG. 1 through a pipe 26B is discharged from between the opening 26A of the supply cylinder 26 and the bottom end outer circumference 25C of the suction cylinder 25. On the other hand, inactive gas is sucked from the opening portion 25A of the loading cylinder 24 by a negative pressure generated by the suction box 27 shown in FIG. 1. In the meantime, according to the first embodiment, N2 is used as the inactive gas. As the inactive gas, for example, Ar may be used and instead of the inactive gas, reducing gas such as H2 may be used.

Subsequently, the solder ball loading process of the solder ball loading apparatus 20 will be described with reference to FIGS. 3-5.

(1) Position Recognition and Correction of the Multilayer Printed Wiring Board

Figure 3A:
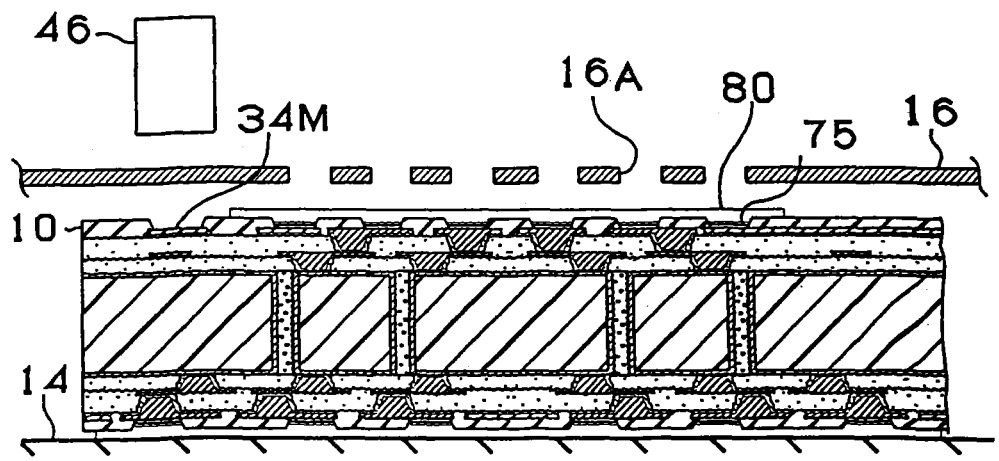
FIG. 3 (A) is an explanatory diagram for positioning a multi-layer printed wiring board and FIG. 3(B) is an explanatory diagram for explaining a supply of the solder balls to the loading cylinder.

The position of the multilayer printed wiring board 10 with respect to the ball arrangement mask 16 is corrected by recognizing an alignment mark 34M on the multilayer printed wiring board 10 with an alignment camera 46 as shown in FIG. 3 (A). That is, that position is adjusted so that the opening 16a in the ball arrangement mask 16 corresponds to the pad 75 of the multilayer printed wiring board 10. Although a single multilayer printed wiring board 10 is indicated for convenience for representation, actually, the solder balls are loaded on a multilayer printed wiring board of a work sheet size which constitutes a plurality of the multilayer printed wiring boards and after the solder bumps are formed, cut out to individual multilayer printed wiring boards.

(2) Supply of Solder Balls

Figure 3B:
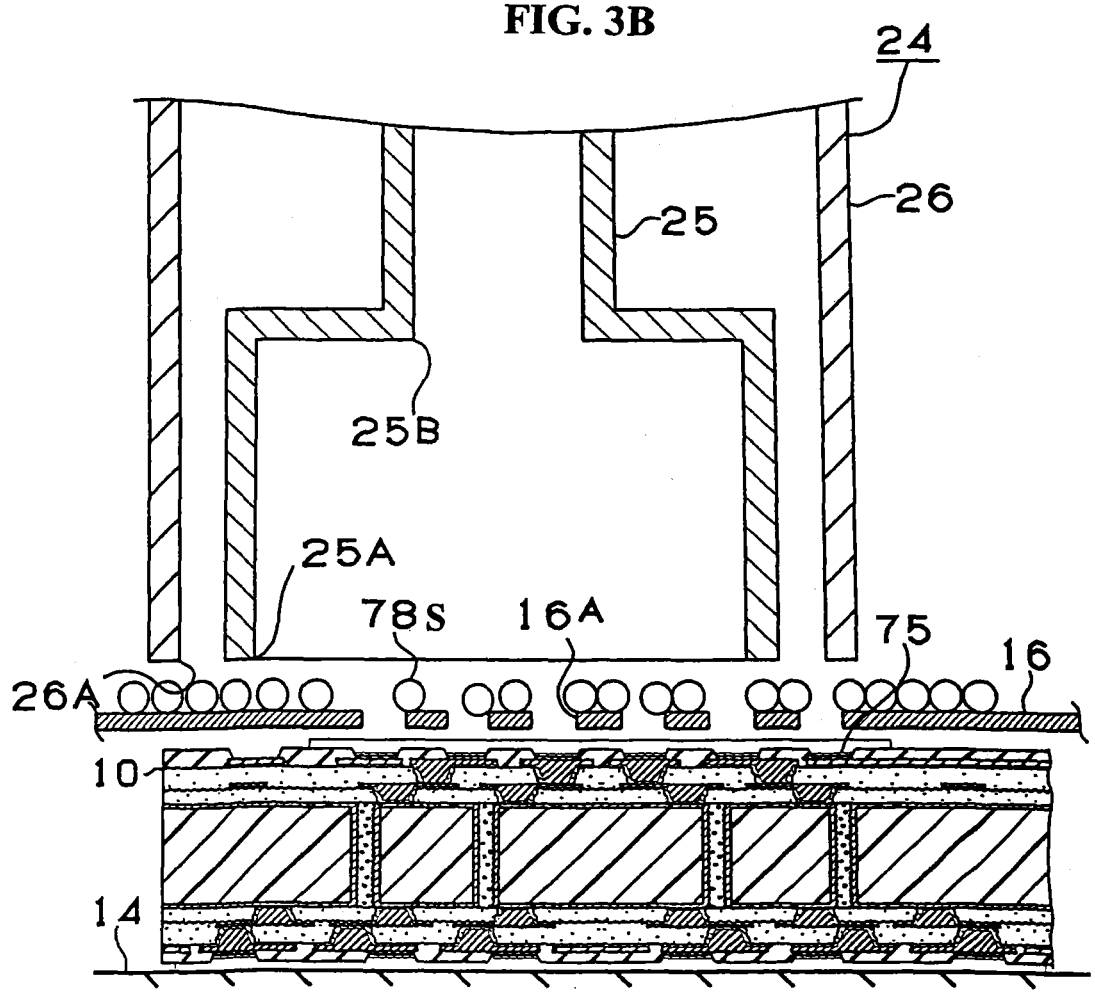

As shown in FIG. 3(B), the solder balls 78s are supplied in a specified quantity from the solder ball supply unit 22 to the side of the loading cylinder 24.

(3) Loading of Solder Balls

Figure 4A:
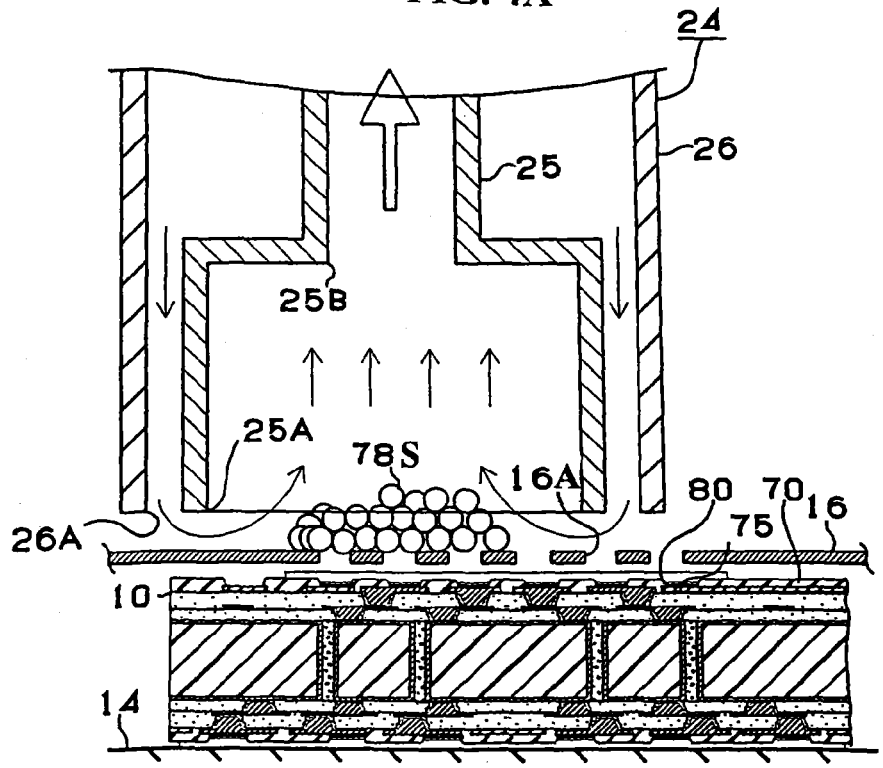
FIG. 4(A) is an explanatory diagram about gathering the solder balls by the loading cylinder and FIG. 4(B) is an explanatory diagram about gathering and introduction of the solder balls with the loading cylinder.

With the loading cylinder 24 located above the ball arrangement mask 16 with a predetermined clearance (for example, 100% to 300% the ball diameter) to the ball arrangement mask, inactive gas or reducing gas is sucked through a suction portion 25B as shown in FIG. 4(A). After the solder balls 78s are gathered on the ball arrangement mask 16 just below the opening portion 25A of the suction cylinder 25 by adjusting the velocity of flow at a gap between the suction cylinder 25 and the printed wiring board to 5 m/sec to 50 m/sec, the printed wiring board 10 and the ball arrangement mask 16 are moved horizontally along the X axis by the XYθ suction table 14 as shown in FIG. 4(B) and FIG. 5(A) and FIG. 1(B) and FIG. 1(A). As a consequence, the solder balls 78s gathered just below the loading cylinder 24 are moved as the ball arrangement mask 16 and the printed wiring board 10 are moved, so that the solder balls are dropped to and loaded on the pad 75 of the multilayer printed wiring board 10 through the opening 16a in the ball arrangement mask 16. Consequently, the solder balls 78s are arranged successively on the entire pad of the multilayer printed wiring board 10.

Figure 4B:
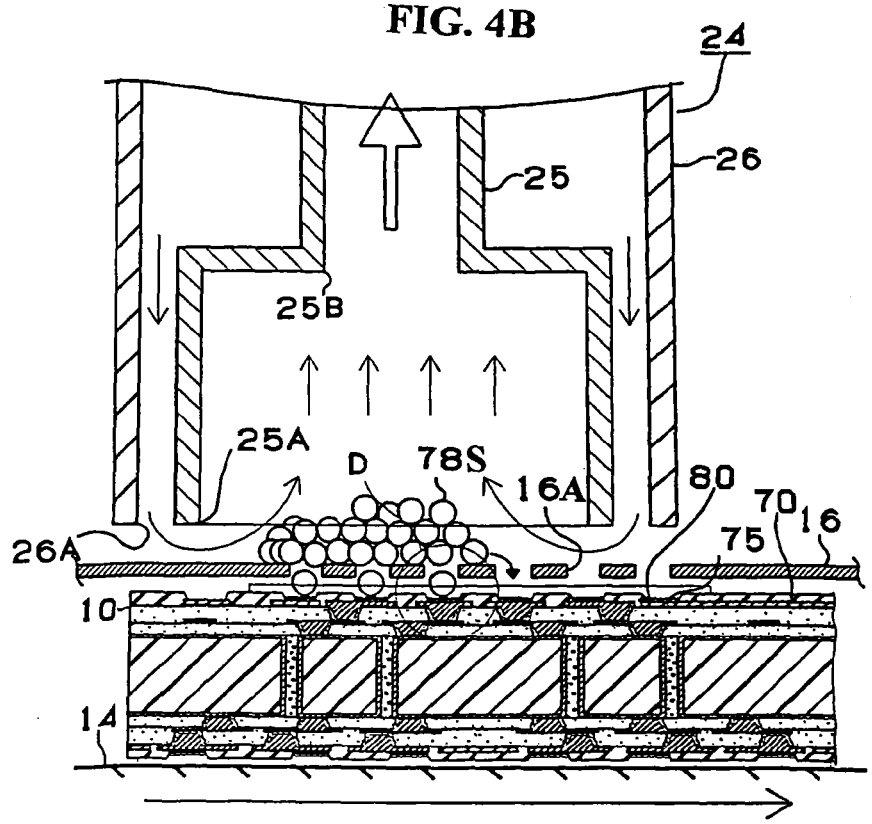
Figure 5A:
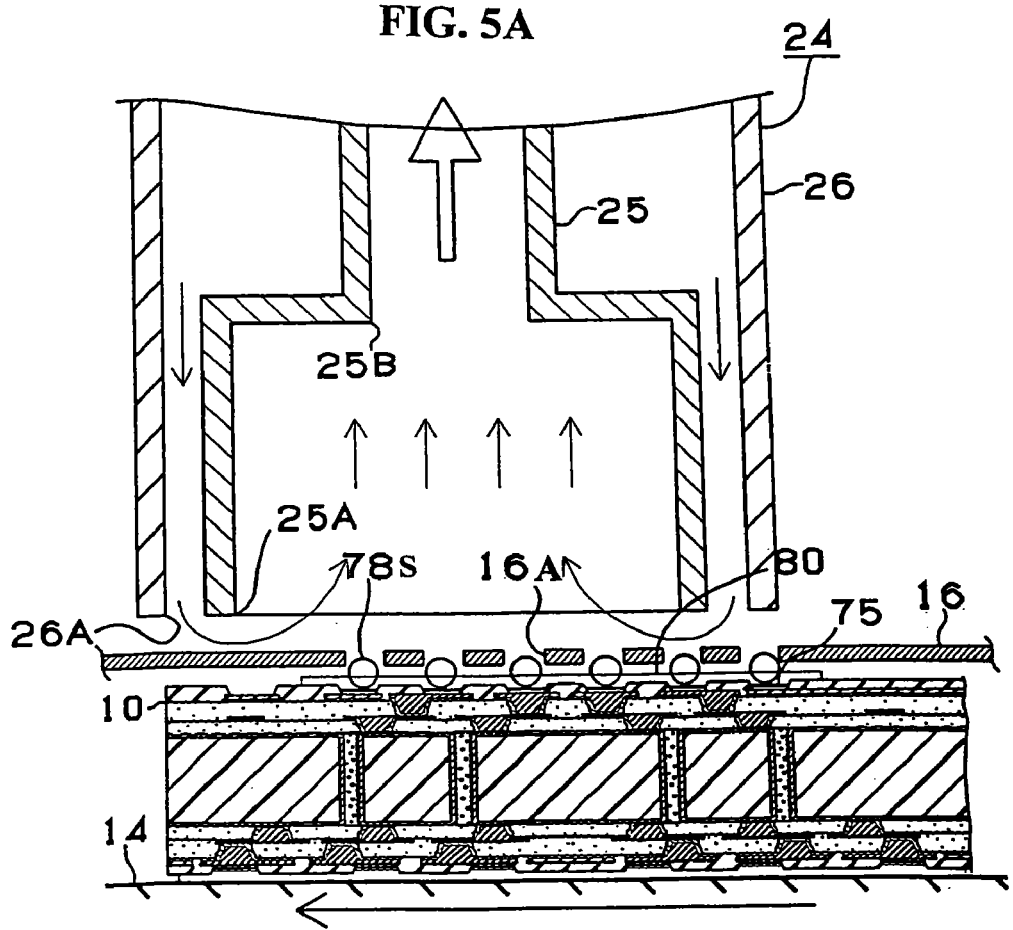
FIG. 5(A) is an explanatory diagram about drop of the solder balls onto the pad and FIG. 5(B) is an explanatory diagram about removal of the solder balls with the ball removing cylinder.
Figure 10A:
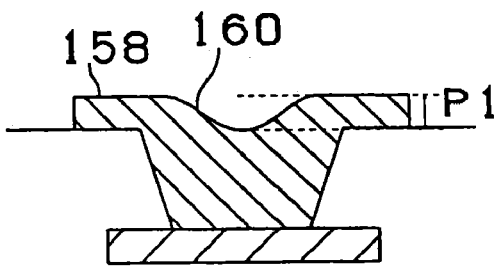
FIGS. 10(A), 10(B) are explanatory diagrams of a filled via hole of the embodiment
Figure 10B:
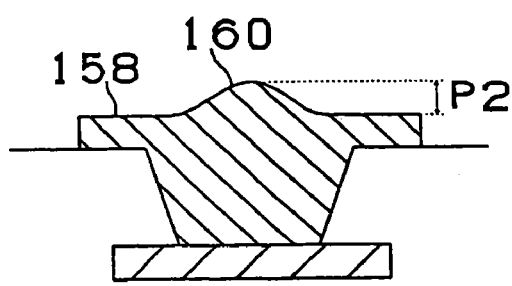
Figure 10C:
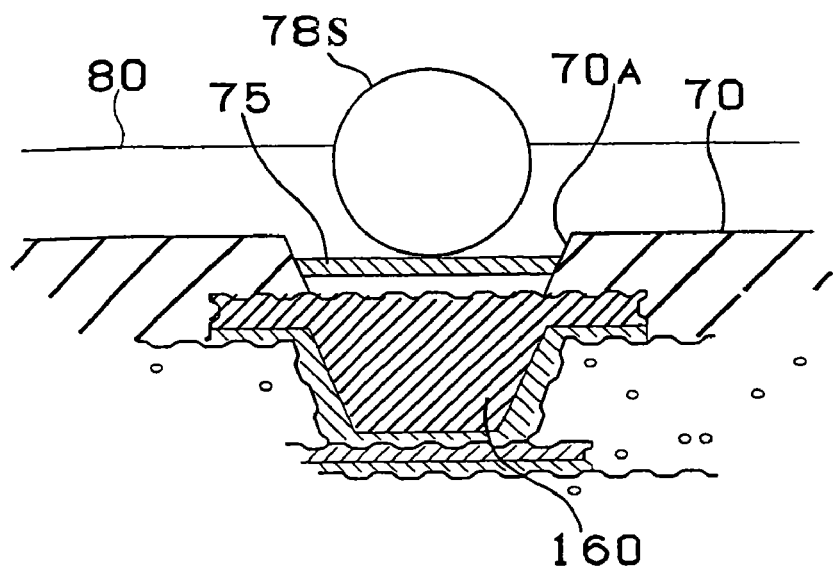
FIG. 10(C) is a magnified diagram showing a portion surrounded by circle D in FIG. 4(B).

FIG. 10(C) is a magnified diagram showing a portion surrounded by a circle D in FIG. 4(B). The bottom portion of the solder ball 78s is covered with flux 80 applied to the pad 75 to block the bottom portion of the solder ball 78s from making contact with air thereby preventing oxidation. Because according to this embodiment, inactive gas or reducing gas is used, the solder ball can be loaded on the pad 75 of the printed wiring board without forming oxide film on the surface of the solder ball. As a consequence, even if oxide film is formed on the top portion exposed from the flux 80 of the solder ball 78s upon reflow, the solder ball 78s is melted quickly because no oxide film exists on the bottom portion of the solder ball, so that the solder bump can be formed without voids (air bubbles) left.

(4) Removing Adhering Solder Balls

Figure 5B:
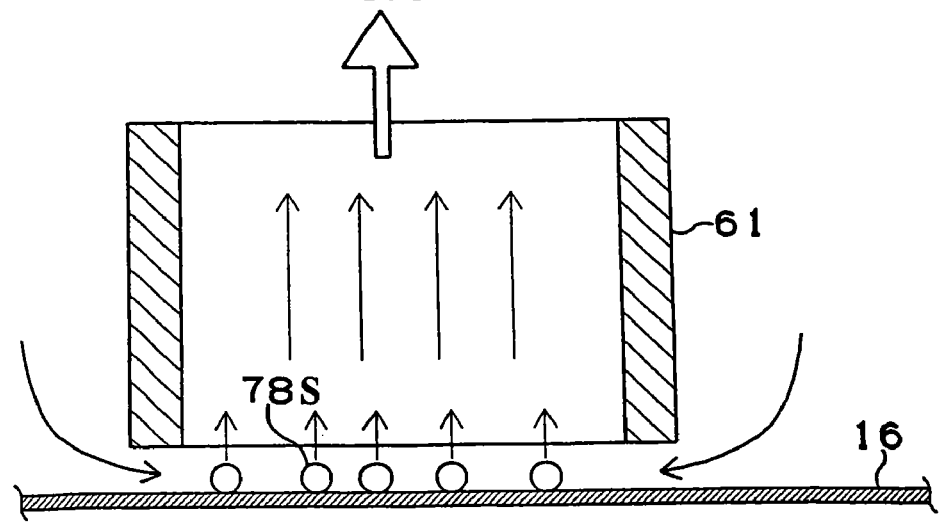

By moving the printed wiring board 10 and the ball arrangement mask 16 as shown in FIG. 5(B), excess solder balls 78s are introduced up to a position having no opening 16a on the ball arrangement mask 16a and sucked and removed with the ball removing cylinder 61.

(5) Taking Out a Substrate

The multilayer printed wiring board 10 is taken out from the XYθ suction table 14.

According to the solder ball loading method and the solder ball loading apparatus 20 of this embodiment, with the loading cylinder 24 located above the ball arrangement mask 16, inactive gas or reducing gas is sucked through the opening portion 25A of the loading cylinder 24 so as to gather the solder balls 78s and then, the gathered solder balls 78s are moved on the ball arrangement mask 16 by moving the ball arrangement mask 16 and the printed wiring board 10 horizontally and dropped onto the pad 75 of the multilayer printed wiring board 10 through the opening 16a in the ball arrangement mask 16. Thus, fine solder balls 78s can be loaded on all the pads 75 of the multilayer printed wiring board 10 securely. Further because the solder balls 78s are moved without any contact, the solder balls can be loaded on the pads 75 without any damage on the solder balls unlike a case using a squeegee so that the heights of the solder bumps 78U can be equalized. Thus, this embodiment excels in loading performance for an electronic component such as the IC, heat cycle test after loading, and environment resistance test such as high temperature/high humidity test. Further, because this does not depend on flatness of a product, the solder ball can be loaded appropriately on the pad of even a printed wiring board having much unevenness on its surface. Further, because fine solder balls can be loaded on the pads securely, the solder bumps whose heights are stable can be obtained even in a printed wiring board in which the pad pitch is 60-150 μm and the opening diameter of the solder resist is 40-100 μm.

Further, aggregation and adherence of the solder balls can be prevented because the solder balls are introduced by suction force. This embodiment can be applied to manufacturing of multiple kinds of products each in a small quantity because it can meet work pieces of a variety size (worksheet sized multilayer printed wiring board) by adjusting the quantity of the loading cylinders 24.

Because in the solder ball loading apparatus of this embodiment, a plurality of the loading cylinders 24 are arranged in line in the Y direction corresponding to the width of a work piece (worksheet sized multilayer printed wiring board) as shown in FIG. 1(B), the solder balls can be loaded on all the pads 75 of the multilayer printed wiring board 10 securely by feeding the ball arrangement mask 16 and the printed wiring board 10 vertically (in the X direction) with respect to the column direction of the loading cylinder 24.

Further, because the solder balls 78s left on the ball arrangement mask 16 can be collected with the ball removing cylinder 61, it doesn't happen that excess solder balls are left leading to a trouble such as malfunction.

Second Embodiment

Figure 9:
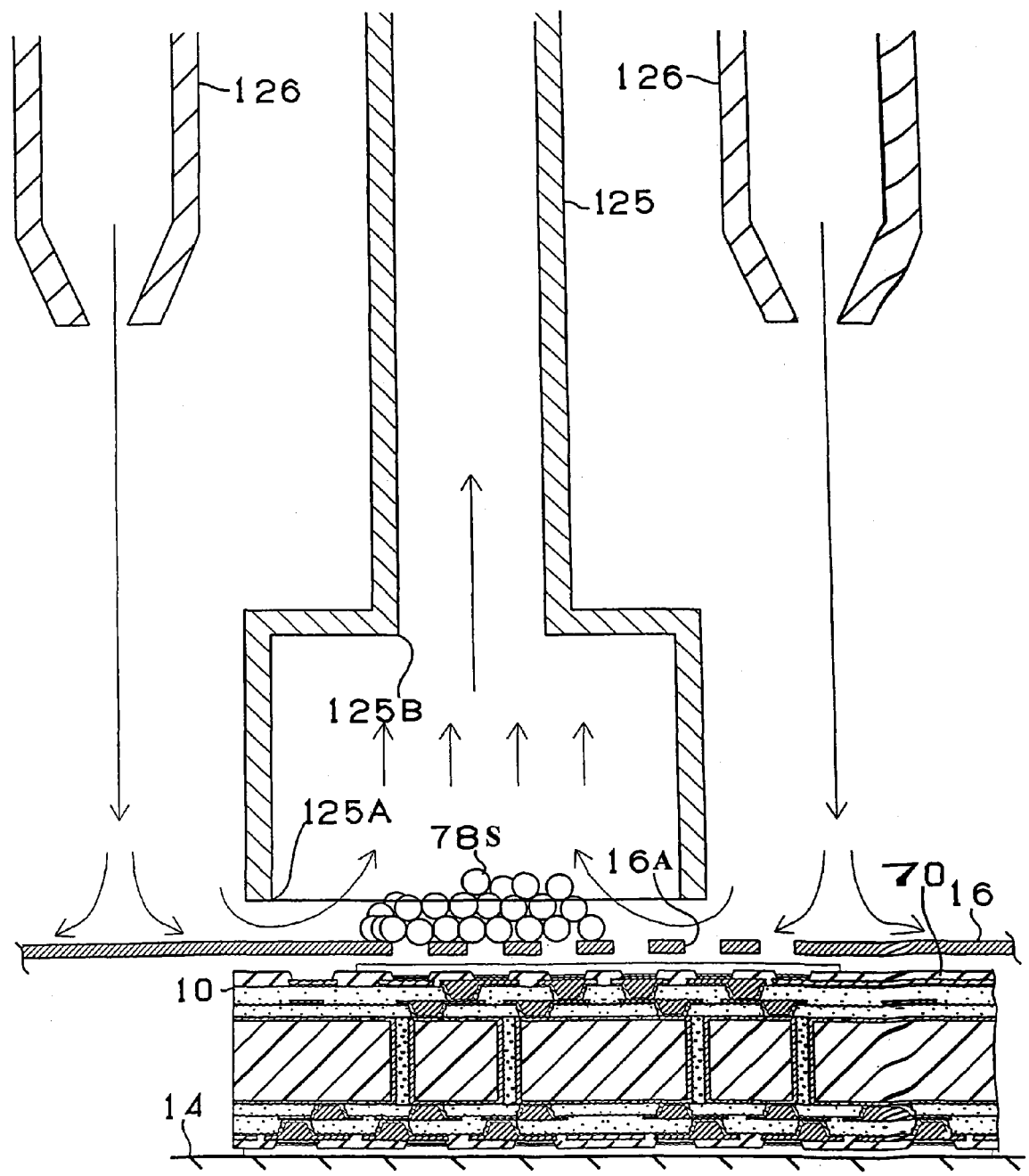
FIG. 9 is a sectional view showing the structure of the loading cylinder of the solder ball loading apparatus according to the second embodiment.

FIG. 9 shows a loading cylinder 125 according to the second embodiment. The loading cylinder described above with reference to FIG. 2 adopts a double structure, in which inactive gas is supplied from the supply cylinder 26 outside the suction cylinder 25. Contrary to this, the second embodiment includes a nozzle 126 for supplying inactive gas to the surrounding of an opening 125A of the loading cylinder 125. The structure of this second embodiment can prevent catching of voids into the solder bumps like the first embodiment.

Hereinafter, the result of a comparison test performed upon a solder bump produced according to the solder ball loading method of the first embodiment and a solder bump produced according to a method of carrying the solder balls by sucking air will be described.

First Embodiment (1) Production of Printed Wiring Board

The through hole conductors and conductive circuits were formed according to a well known method using double side copper clad laminate (for example, manufactured by HITACHI CHEMICAL CO., LTD. MCL-E-67). After that, a pad group comprised of 50×50 pads (grid structure) each having a diameter of 150 μm and arranged at a pitch of 150 μm to connect the conductive circuit layer on the outermost layer to an IC by placing the interlayer insulation layer and the conductive circuit layer alternately according to a known method (for example, "Built-up Multilayer Printed Wiring Board" written by Kiyoshi Takagi, issued by NIKKAN KOGYO SHIMBUN, LTD., Jun. 20, 2000). Marketed solder resist was formed thereon and an opening 100 μm in diameter was formed in the pad by photographic method. The connecting pad composed of a via hole (solder bump formed just above the via hole) is preferred to be so constructed as a filled via hole that with respect to the thickness of the conductive circuit 158, the amount of recession P1 in the surface (amount of recession from the top end face) is less than −5 μm as shown in FIG. 10(A) and the amount of protrusion P2 (amount of protrusion from the top flat surface) is less than +5 μm. Because the contact point between the solder ball and the connecting pad composed of the filled via hole decreases if the amount of recession of the filled via hole exceeds 5 μm (−5 μm), wettability of the solder bump worsens, so that void is likely to be caught into the solder or no solder ball is loaded (missing bump). On the other hand, if it exceeds 5 μm, the thickness of the conductive circuit 158 increases, which is not suitable for the fine structure.

(2) Loading of Solder Ball

Marketed rosin base flux was applied to the surface (IC loading surface) of a printed wiring board manufactured in (1). After that, the printed wiring board was loaded on the suction table of the solder ball loading apparatus of the present invention described above and the positions of the printed wiring board and the ball loading mask were matched by recognizing alignment marks of the printed wiring board and ball loading mask with a CCD camera. Here, as the ball loading mask, a Ni-made metal mask 25 μm-50 μm thick having an opening 110 μm in diameter at a position corresponding to the pad of the printed wiring board was used. It is permissible to use SUS made or polyimide ball loading mask. In the meantime, the diameter of the opening formed in the ball loading mask is preferred to be 1.1 to 1.5 larger than the diameter of a ball for use. A loading cylinder of a size corresponding to the pad area (1.2-3 times the size of the pad area), 200 mm high was located on the printed wiring board with a clearance of two times the size of the solder ball and a Sn63Pb37 solder ball of 80 μm in diameter (manufactured by HITACHI METALS, LTD.) was loaded on a ball loading mask in the neighborhood.

Although this embodiment utilizes Sn/Pb solder as the solder ball, it may be Pb free solder selected from a group comprised of Sn, Ag, Cu, In, Bi, Zn and the like. The velocity of flow at a gap between the suction cylinder 25 and the printed wiring board was adjusted to 5-35 m/sec by sucking inactive gas or reducing gas through the suction cylinder 25 to gather the solder balls within the loading cylinder. After that, the ball arrangement mask 16 and the printed wiring board 10 were moved at a moving velocity of 40 mm/sec to move the solder balls and dropped from an opening portion in the ball loading mask and loaded on the pad. Next, excess solder balls were removed from the ball loading mask and then, the solder ball loading mask and the printed wiring board were removed from the solder ball loading apparatus individually. Finally, the produced printed wiring board was thrown into reflow process set at 2300 to create solder bumps.

Example for Reference

The example for reference is the same as the first embodiment except that the method for supplying the solder ball to the pad is changed. That is, the solder ball is moved in the air by sucking air with the suction cylinder 25 and then dropped from the opening portion for loading the ball and loaded on the pad.

Evaluation Test

The solder bumps of the embodiment and reference example were observed with an X-ray inspection apparatus (manufactured by NAGOYA DENKI KOGYO NLX3500F). Although no void was noticed in the solder bump of the embodiment, void was observed in the solder bump of the reference example.

Although the invention has been disclosed in the context of a certain preferred embodiments, it will be understood that the present invention extends beyond the specifically disclosed embodiments to other alternative embodiments of the invention. Thus, it is intended that the scope of the invention should not be limited by the disclosed embodiments but should be determined by reference to the claims that follow.

What is claimed is:

1. A solder ball loading method for loading solder balls that turn to be solder bumps on pads of a printed wiring board using a ball arrangement mask having a plurality of openings corresponding to the pads in the printed wiring board, the solder ball loading method comprising:

locating a cylinder member above the ball arrangement mask such that an opening portion of the cylinder member is facing the ball arrangement mask and provided a predetermined distance above the ball arrangement mask;

supplying inactive gas or reducing gas at least to an area outside of and surrounding the opening portion in the cylinder member, and sucking air from an interior of the cylinder member to produce a negative pressure within the cylinder member such that the inactive gas or reducing gas around the cylinder memberis sucked into the cylinder member to cause gathering of solder balls on the ball arrangement mast just below a cylinder member; and dropping the solder balls gathered just below the cylinder member onto the pads on the printed wiring board through the opening in the ball arrangement mask by moving the cylinder member or the ball arrangement mask and the printed wiring board.

2. The solder ball loading method of claim 1, wherein said supplying an inactive gas or reducing gas comprises supplying the inactive gas or reducing gas from a supply cylinder which surrounds the opening of the cylinder member.

3. The solder ball loading method of claim 1, wherein said supplying an inactive gas or reducing gas comprises flowing the inactive gas or reducing gas from a plurality of nozzles toward the an outer periphery of the opening of the cylinder member.

4. The solder ball loading method of claim 1, wherein said predetermined distance above the ball arrangement mask is from 100% to 300% of a diameter of the solder balls being loaded.

5. The solder ball loading method of claim 1, further comprising providing a conductive surface on the at least a solder ball contact area of the cylinder member such that static charges solder balls will not stick to the solder ball contact area.

* * * * *